United States Patent
Kim et al.

(10) Patent No.: US 7,298,643 B2
(45) Date of Patent: Nov. 20, 2007

(54) MRAM ELEMENT

(75) Inventors: Joo-Von Kim, Massy (FR); Thibaut Devolder, Massy (FR); Claude Chappert, Garches (FR); Cedric Maufront, Grenoble (FR); Richard Fournel, Lumbin (FR)

(73) Assignees: STMicroelectronics SA, Montrouge (FR); Centre National de la Recherche Scientifique, Paris Cedex (FR); Universite de Paris SUD (Paris XI), Orsay (FR)

( * ) Notice: Subject to any disclaimer, the term of this patent is extended or adjusted under 35 U.S.C. 154(b) by 193 days.

(21) Appl. No.: 11/114,305

(22) Filed: Apr. 25, 2005

(65) Prior Publication Data

US 2005/0237796 A1 Oct. 27, 2005

(30) Foreign Application Priority Data

Apr. 26, 2004 (FR) .................................. 04 50779

(51) Int. Cl.
*G11C 11/00* (2006.01)

(52) U.S. Cl. ...................... 365/158; 365/171; 365/173; 365/225.5

(58) Field of Classification Search ................ 365/158, 365/171, 173, 225.5
See application file for complete search history.

(56) References Cited

U.S. PATENT DOCUMENTS

| | | | |
|---|---|---|---|
| 5,953,248 A | 9/1999 | Chen et al. .................. 365/158 |
| 6,021,065 A * | 2/2000 | Daughton et al. ........... 365/158 |
| 6,545,906 B1 | 4/2003 | Savtchenko et al. ......... 365/158 |
| 6,633,498 B1 * | 10/2003 | Engel et al. .................. 365/158 |
| 6,674,664 B2 * | 1/2004 | Pohm .......................... 365/173 |
| 6,956,764 B2 * | 10/2005 | Engel et al. .................. 365/158 |
| 7,095,646 B2 * | 8/2006 | Slaughter et al. ............ 365/158 |
| 2003/0048676 A1 | 3/2003 | Daughton et al. ........... 365/200 |
| 2003/0072174 A1 | 4/2003 | Savtchenko et al. ......... 365/158 |

\* cited by examiner

*Primary Examiner*—Richard T. Elms
*Assistant Examiner*—Toan Le
(74) *Attorney, Agent, or Firm*—Lisa K. Jorgenson; David V. Carlson; Seed IP Law Group PLLC

(57) ABSTRACT

A magnetoresistive memory element including a trapped magnetic region and a free magnetic region separated by a barrier layer. The free magnetic region comprises a stacking of at least two antiferromagnetically-coupled ferromagnetic layers, a layer magnetic moment vector being associated with each layer, the resulting magnetic moment vector, equal to the sum of the layer magnetic moment vectors, having an amplitude smaller than at least 40% of the amplitude of the layer magnetic moment vector of maximum amplitude. The anisotropy field and/or the demagnetizing field tensor is not identical for the at least two ferromagnetic layers, whereby the angular deviations of the layer magnetic moment vectors are different at the time of the application of an external magnetic field, which enables at least two methods for directly writing into the memory element, as well as its initialization.

24 Claims, 3 Drawing Sheets

MRAM ELEMENT

BACKGROUND OF THE INVENTION

1. Field of the Invention

The present invention relates to a Magnetic Random Access Memory (MRAM) element, and especially to a memory element to be used in a MRAM comprising an array of memory elements.

2. Description of the Related Art

A MRAM element is generally characterized by a magnetic moment vector having an orientation that can be modified by the application of an external action, especially a magnetic field. Specific information is stored in the memory element by orienting the magnetic moment vector along a selected direction and/or orientation. The memory element can keep information for a long time without requiring refreshment of the memory element in the absence of a power supply, which is a significant advantage of this type of memory. As an example, to store binary information, a memory element having a selected-magnetization axis may be provided. The magnetic moment vector is then oriented along a selected-magnetization axis in a first direction to store a first state of the information and in the opposite direction to store a second state of the information.

A conventional method for reading information stored in a MRAM element consists of detecting the resistance differences in the memory element according to the orientation of the magnetic moment vector. A conventional method for writing to a memory element involves write magnetic fields generated by running currents through metal lines external to the memory element. In unconventional fashion, it has also been provided to use the effects caused by a current sent through the actual memory element. Such effects especially are: the magnetic field created by the current, a thermal effect induced by Joule effect, or a transfer effect of the spin angular momentum of the conduction elements towards the magnetization.

FIG. 1 shows the simplified diagram of a conventional magnetic memory. MRAM 10 is formed of first lines of a conductive material forming word lines 12 arranged perpendicularly to second lines of a conductive material forming bit lines 14. Period p of the network of word lines 12 and period p' of the network of bit lines 14 generally are on the order of a few times width w of a metal track and may be different. A memory element 16 is arranged at the intersection of each word line 12 and of each bit line 14. The write process then involves magnetic fields generated by running currents through word lines 12 and bit lines 14.

A realistic diagram of a magnetic memory may be more complex and involve, for example, for reading purposes, a diode or a transistor in series with each memory element with no significant influence upon the present invention.

It is currently attempted to increase the density of magnetic memories, that is, to increase the number of memory elements per surface area unit. A difficulty results due to the fact that, by dipolar interaction, the magnetic moment of a considered memory element is likely to disturb the behavior of adjacent memory elements, the difficulty increases as the memory density increases. A disturbance for example translates as a degradation in the reliability of the process of information writing into the memory elements adjacent to the considered memory element, or as a degradation in the information retention time in the adjacent memory elements.

To avoid such a disadvantage, the use of a memory element, which, in the absence of application of an external magnetic field, has a very small magnetic moment, is preferred. Such a memory element is said to be compensated. A compensated memory element has a negligible influence upon the adjacent memory elements as soon as it is moved away from the memory element by a distance greater than a small multiple of the thickness of the memory element.

FIG. 2 schematically shows an example of a compensated memory element, of the type of the memory element described in U.S. Pat. No. 6,545,906.

Memory element 16 is placed between a word line 12 and a bit line 14, without requiring a specific assumption concerning a possible contact between memory element 16 and word line 12 and/or bit line 14, nor concerning the presence of additional layers between memory element 16 and word line 12 and/or bit line 14. As an example, word line 12 is placed at the top of memory element 16 and bit line 14 is placed at the base of memory element 16 and is directed according to a 90° angle with respect to word line 12.

Magnetic regions 18, 22 are formed by synthetic antiferromagnet structures, also called SAF structures. More specifically, memory element 16 comprises a first magnetic region 18, a barrier layer 20, and a second magnetic region 22, barrier layer 20 being sandwiched between first magnetic region 18 and second magnetic region 22. First magnetic region 18 includes a three-layer structure which includes a separation layer 24 sandwiched between two ferromagnetic layers 26, 28, and which induces an antiferromagnetic coupling between the two ferromagnetic layers 26, 28. Second magnetic region 22 includes a three-layer structure which comprises a separation layer 30 sandwiched between two ferromagnetic layers 32, 34 and which induces an antiferromagnetic coupling between the two ferromagnetic layers 32, 34. Ferromagnetic layers 26, 28 respectively have magnetic moment vectors $\vec{\mu}_1$, $\vec{\mu}_2$ which are maintained antiparallel by coupling through separation layer 24. Similarly, ferromagnetic layers 32, 34 respectively have magnetic moment vectors $\vec{\mu}_3$, $\vec{\mu}_4$ which are maintained antiparallel by coupling through separation layer 30. Each ferromagnetic layer may be formed of several ferromagnetic layers coupled by interfacial exchange interactions.

Magnetic region 18 is called a free magnetic region since $\vec{\mu}_1$ and $\vec{\mu}_2$ are free to pivot in the presence of a magnetic field applied to memory element 16. Magnetic region 22 is called a trapped magnetic region since $\vec{\mu}_3$ and $\vec{\mu}_4$ are not free to pivot in the presence of a magnetic field having a moderate amplitude, magnetic moment vector $\vec{\mu}_4$ being set in a selected direction. This result is generally obtained by deposition of layer 34 on an antiferromagnetic film which has no significant influence upon the present invention. Magnetic region 22 can thus be used as a reference magnetic region.

Magnetic regions 26, 28, 32, 34 have substantially parallel selected-magnetization axes along which magnetic moment vectors $\vec{\mu}_1$, $\vec{\mu}_2$, $\vec{\mu}_3$, $\vec{\mu}_4$ orient in selected fashion. The storage of information in a memory element 16 is obtained by orienting $\vec{\mu}_1$ in parallel with or antiparallel to $\vec{\mu}_3$. The reading of the information stored in the memory element is performed by having a current run through the memory element and by detecting the resistance differences in memory element 16 according to the orientation of $\vec{\mu}_1$. Indeed, the resistance depends on the relative orientation of $\vec{\mu}_1$ with respect to $\vec{\mu}_3$.

To avoid magnetic moments of memory element 16 from disturbing the adjacent memory elements, magnetic regions 18, 22 are compensated, that is, the materials and/or the volumes of ferromagnetic regions 26, 28, 32, 34 are selected so that the resulting magnetic moment $\vec{\mu}_{tot}$ of free magnetic region 18, equal to $\vec{\mu}_1 + \vec{\mu}_2$ and the resulting magnetic moment vector of trapped magnetic region 22, equal to $\vec{\mu}_3 + \vec{\mu}_4$, are substantially equal to the zero vector. This then enables increasing the density of magnetic memory 10 with respect to a simple memory element, the free magnetic region of which would be formed of a single ferromagnetic layer, as is the case in a conventional memory element.

Further, in a compensated memory element, the minimizing or the optimizing of the interaction, mainly of dipolar origin, between magnetic regions 18 and 22 must be taken into account in the structure details of these regions. For simplification, this point will not be considered in the following description, while having verified that it has no significant influence upon the present invention.

Conventionally, the writing of information into memory element 16 is obtained by the generation of magnetic fields adapted to orient $\vec{\mu}_1$ in a selected direction and way. Since $\vec{\mu}_1$ and $\vec{\mu}_2$ are maintained antiparallel by the antiferromagnetic interaction through layer 24, it is equivalent to control the orientation of $\vec{\mu}_1$ or that of $\vec{\mu}_2$. The write magnetic fields are created by the flowing of currents in word line 12 and bit line 14.

The definition of magnetic fields for the writing of a single memory element 16 is a delicate process. Indeed, it must be avoided for the write magnetic fields resulting from the flowing of currents in a word line 12 and a bit line 14 to cause a writing into other memory elements 16, for example, the memory elements connected to the same word line or to the same bit line, and the memory elements neighboring the addressed memory element. The obtaining of proper write magnetic fields is generally more difficult still when the free magnetic region of the memory element has a compensated or almost compensated structure since the modification of the orientation of the magnetic moment vectors of the memory elements tends to require more intense magnetic fields, in particular to overcome the interaction between the layers of the free magnetic region. Further, when a magnetic field is applied to the memory element, it is difficult to ensure that resulting moment $\vec{\mu}_{tot}$ of free magnetic region 18 maintains during the write process a sufficiently low amplitude to avoid disturbing the adjacent memory elements.

To achieve very high integration densities, two other contradictory phenomena must be controlled. The first phenomena is that when the volume of free magnetic region 18 decreases, the preservation of a sufficient information retention time requires increasing the total magnetic anisotropy of the sample, which, in general, increases the amplitude of the magnetic fields required for the write process. The second phenomenon is due to the fact that the maximum admissible current density in a conductive line is limited by physical phenomena (Joule effect, electromigration). The maximum current that can be injected for a write process and the write magnetic field, which is proportional thereto thus decrease along with the conductive line cross-section as the memory density is increased.

U.S. Pat. No. 6,545,906 describes a specific compensated or almost compensated memory element write process.

BRIEF SUMMARY OF THE INVENTION

The present invention aims at obtaining a specific compensated or almost compensated memory element structure, especially intended for use in a MRAM, enabling direct writing, with no previous reading, of information into the memory element by means of currents having moderate amplitudes, and enabling pushing back the previously-described limits for obtaining a high density of memory cells.

To achieve this objective, the present invention provides a magnetoresistive memory element having a trapped magnetic region and a free magnetic region separated by a barrier layer, the free magnetic region including a stack of at least two antiferromagnetically-coupled ferromagnetic layers, a layer magnetic moment vector being associated with each layer, the resulting magnetic moment vector, equal to the sum of the layer magnetic moment vectors, having an amplitude smaller than at least 40% of the amplitude of the layer magnetic moment vector of maximum amplitude, in which the anisotropy field and/or the demagnetizing field tensor is not identical for the at least two ferromagnetic layers, whereby the angular deviations of the layer magnetic moment vectors are different at the time of the application of an external magnetic field.

According to an embodiment of the present invention, the free magnetic region includes a stack of at least two pairs of antiferromagnetically-coupled ferromagnetic layers, a layer magnetic moment vector being associated with each layer, the resulting magnetic moment vector of each layer pair, equal to the sum of the magnetic moment vectors of the ferromagnetic layers of the pair of ferromagnetic layers, having an amplitude smaller than at least 40% of the amplitude of the layer magnetic moment vector of maximum amplitude, the adjacent ferromagnetic layers of the two pairs of ferromagnetic layers being ferromagnetically coupled. The anisotropy field and/or the demagnetizing field tensor is not identical for the two ferromagnetic layers of at least one pair of ferromagnetic layers, the arrangement and the properties of the ferromagnetic layers in each pair of ferromagnetic layers being adapted so that the layer magnetic moment vectors of two ferromagnetically-coupled adjacent ferromagnetic layers acquire identical angular deviations at the time of the application of an external magnetic field.

According to an embodiment of the present invention, the free magnetic region includes a stack of at least a first, a second, and a third ferromagnetic layers, the first and second ferromagnetic layers being antiferromagnetically coupled, the second and third ferromagnetic layers being antiferromagnetically coupled, a layer magnetic moment vector being associated with each of the first, second, and third ferromagnetic layers, the resulting magnetic moment vector, equal to the sum of the layer magnetic moment vectors of the first, second, and third ferromagnetic layers, having an amplitude smaller than at least 40% of the amplitude of the magnetic moment vector of the second ferromagnetic layer. The anisotropy fields and/or the demagnetizing field tensors of the first or third ferromagnetic layer and of the second ferromagnetic layer are different, whereby the angular deviations of the layer magnetic moment vectors of the first and third ferromagnetic layers are identical and different from the angular deviation of the second ferromagnetic layer at the time of the application of an external magnetic field.

The present invention also provides a method for writing into a memory element as defined hereabove, in which the magnetic moment vector of the ferromagnetic layer of the free magnetic region in contact with the barrier layer is oriented according to one of the two opposite orientations of a selected direction, comprising, at concurrently, the steps of applying a first magnetic field along the selected direction; and applying a second magnetic field according to a direction substantially perpendicular to the selected direction.

According to an embodiment of the present invention, the demagnetizing field tensors and/or the anisotropy fields of crystallographic origin are not identical for the at least two ferromagnetic layers, the second magnetic field being applied, during the application of the first magnetic field, in the form of a pulse having a rise time smaller than half the smallest precession period of the ferromagnetic layers.

According to an embodiment of the present invention, the effective planar anisotropy fields of the at least two antiferromagnetically-coupled ferromagnetic layers have different amplitudes, the first and second magnetic fields being simultaneously applied for a time period longer than the relaxation times of the layer magnetic moment vectors of the at least two antiferromagnetically-coupled ferromagnetic layers of the free magnetic region towards respective determined equilibrium positions.

According to an embodiment of the present invention, the amplitude of the second magnetic field is smaller than half the amplitude of the first magnetic field.

According to an embodiment of the present invention, the setting times and/or the durations of application of the first and second magnetic fields are different.

According to an embodiment of the present invention, the first and second magnetic fields are applied globally to a memory formed of memory elements such as defined hereabove, by using a magnetic field source external to the memory, whereby the memory is initialized.

According to an embodiment of the present invention, the first and second magnetic fields are applied globally to a memory formed of memory elements such as defined hereabove, by using a magnetic field source external to the memory, whereby the memory is fully erased.

The foregoing object, features, and advantages of the present invention, as well as others, will be discussed in detail in the following non-limiting description of specific embodiments in connection with the accompanying drawings.

DETAILED DESCRIPTION OF THE INVENTION

The applicant has determined, by many trials and simulations, that by providing a dissymmetry of certain magnetic properties of the ferromagnetic layers forming the free magnetic region of the memory element, it is possible to perform a direct writing into the memory element, even with a compensated structure, by using write magnetic fields of moderate amplitudes.

According to a first example of implementation of the write method according to the present invention, which will be described in further detail hereafter, it is desired to obtain a compensated or almost compensated magnetic region for which one of the following properties or the following two properties are different:

the anisotropy fields of crystallographic origin;

the demagnetizing field tensors.

"Demagnetizing field tensor" is used to designate the tensor having its matrix product with the direction cosines of the magnetization of the ferromagnetic layer providing the demagnetizing field in this layer.

Indeed, these values are those mainly involved in the phenomena implemented in the first example of implementation of the write method according to the present invention.

The differentiation of the components according to the stacking direction of the ferromagnetic layer demagnetizing field tensors is obtained by providing ferromagnetic layers having different geometries, and/or, different thicknesses.

The differentiation of the anisotropy fields of crystallographic origin is obtained by one of the following possibilities or by a combination of the following possibilities:

by providing ferromagnetic layers formed of different materials;

by providing layers having undergone different processes in order to stabilize different crystallographic structures, for example by deposition conditions, anneals under magnetic field, or ion implantations.

Figure 1:
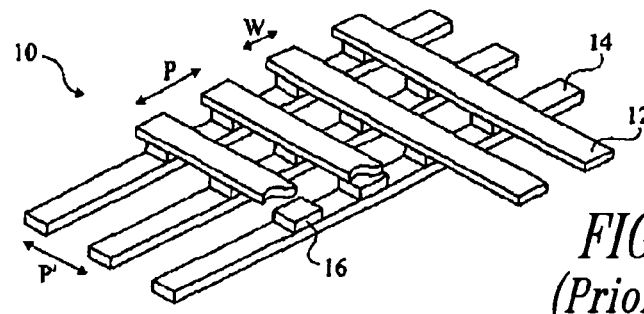
FIG. 1, previously described, schematically shows a conventional MRAM.
Figure 2:
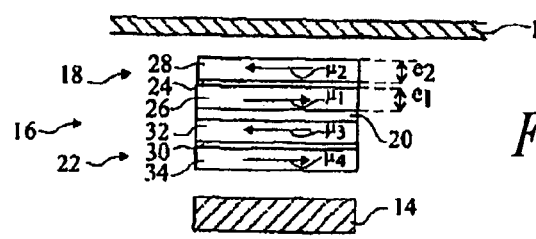
FIG. 2, previously described, schematically shows an example of a memory element with a compensated structure.

The present invention applies to a memory element 16, of the type shown in FIG. 2, having its free magnetic region 18 comprising two antiferromagnetically-coupled ferromagnetic layers 26, 28 which respectively have thicknesses $e_1$ and $e_2$. Different thicknesses $e_1$ and $e_2$ may be obtained, while maintaining the compensation of free magnetic region 18, especially by one of the following possibilities or by a combination of the following possibilities:

ferromagnetic layers 26, 28 are formed of two different ferromagnetic materials having different saturation magnetizations;

ferromagnetic layers 26, 28 have different cross-sections in a plane perpendicular to the stacking direction.

Figure 3:
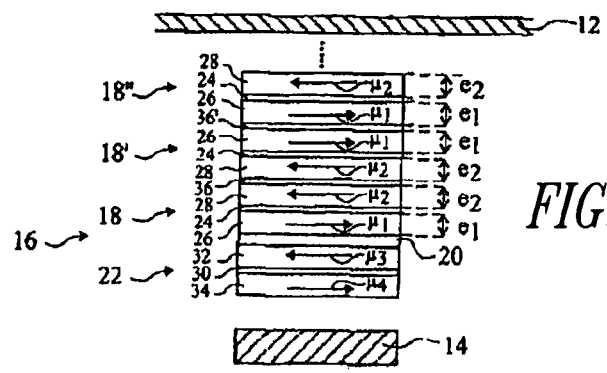
FIG. 3 schematically shows an example of a memory element with a compensated structure according to the present invention.

The present invention also applies to a memory element where its free magnetic region includes a stacking of several free compensated or almost compensated magnetic regions as shown in FIG. 3.

In this stacking, the following conditions must be respected:

the stacking starts at the contact of barrier layer 20 with a first free compensated or almost compensated magnetic region 18;

above a first separation layer 36 covering first free magnetic region 18, a second free magnetic region 18' which must be symmetrical to the first free magnetic region 18 with respect to the median plane of separation layer 36 is provided;

above a second separation layer 36' covering second free magnetic region 18', a third free magnetic region 18" which must be symmetrical to second free magnetic region 18' with respect to the median plane of second separation layer 36' is provided, which results back in free magnetic region 18;

and so on, according to needs, so that the same type of ferromagnetic layer (26 or 28) is found on either side of a separation region 36, 36', etc.;

separation regions 36, 36', etc. induce a strong ferromagnetic coupling between the ferromagnetic layers that they separate, thus keeping their magnetic moment vectors parallel.

With the above-discussed stacking conditions, each of magnetic moment vectors $\vec{\mu}_1$ (respectively, $\vec{\mu}_2$) of each free magnetic region 18, 18', 18", etc. will exhibit the same behavior under the effect of the write magnetic field sequences of the present invention, and this behavior will be identical to that which would have been exhibited by vector $\vec{\mu}_1$ (respectively, $\vec{\mu}_2$) of a single free magnetic region such as shown in FIG. 2. Thus, in the write phase, the ferromagnetic coupling induced by separation layers 36, 36', etc. has but a marginal influence upon the process, and the write parameters will be the same for a free ferromagnetic region (FIG. 2) and a stacking of free ferromagnetic regions (FIG. 3) of same layers 24, 26, and 28. However, in the information retention phase, the ferromagnetic couplings induced by separation layers 36, 36', etc. gather in a same magnetic volume all the free magnetic regions of the stacking, increasing by a factor at least equal to the number of stacked regions the magnetic volume which intervenes in the thermal stability of the recording. Thus, by increasing the number of stacked magnetic regions, it becomes possible to optimize the operation of the memory element by one of the following actions or by a combination of the following actions:

reducing the effective general anisotropy of each free magnetic region 18, 18', 18", etc., which enables reducing the amplitude of the write magnetic fields, reducing the lateral dimensions of a MRAM element without having to increase its total magnetic anisotropy.

These points are very advantageous with a view to increasing the density of MRAMs.

Further, since each free magnetic region is compensated or almost compensated, the increase in the number of regions in the stacking is performed with no significant increase in the total magnetic moment, and thus without generating negative effects linked to dipolar interactions between cells.

This periodic stacking model is described hereabove for the case where the write fields are uniform across the entire thickness of the stacking. A moderate deviation with respect to this constraint may easily be compensated for by an adjustment of the parameters of each free magnetic region of the stacking.

An alternative embodiment with a smaller stack of the type shown in FIG. 3 comprises two free magnetic regions 18, 18' only, between which separation layer 36 has been brought down to a zero thickness. The free magnetic region then comprises a stacking of three ferromagnetic layers: a lower ferromagnetic layer, an intermediary ferromagnetic layer, and an upper ferromagnetic layer.

According to a second example of implementation of the write method according to the present invention, which will be described in further detail hereafter, it is desired to obtain a compensated or almost compensated free magnetic region for which the effective planar free magnetic fields of the ferromagnetic layers are different. The effective planar anisotropy field of a ferromagnetic layer is the general anisotropy field, which characterizes the anisotropy of the magnetic power of the ferromagnetic layer when its magnetization rotates in the plane perpendicular to the stacking direction. This effective anisotropy field integrates the anisotropy field of crystallographic origin and the shape anisotropy due to the anisotropy of the demagnetizing field tensor.

The difference between the planar effective anisotropy fields of the ferromagnetic layers can thus be obtained by one of the following possibilities or by a combination of the following possibilities:

ferromagnetic layers 26, 28 are formed of two different ferromagnetic materials having different saturation magnetizations;

ferromagnetic layers 26, 28 have anisotropies of different shapes, which can be obtained by changing the cross-section of the layers in a plane perpendicular to the stacking direction, or by creating layers of different thicknesses;

ferromagnetic layers 26, 28 have magnetic anisotropies of different crystallographic nature.

The present invention also applies to a stacking of free compensated or almost compensated ferromagnetic layers, such as shown in FIG. 3, with the same conditions relative to the forming of the stacking as those described hereabove for the first example of the present invention, and providing the same advantages.

According to the first and to the second examples of implementation of the write method according to the present invention, the applicant has pointed out that at the time of the application of adapted write magnetic fields, magnetic moment vectors $\vec{\mu}_1$ and $\vec{\mu}_2$ of opposite directions of at least two ferromagnetic layers move with different trajectories, however correlated through the antiferromagnetic interaction binding them. This enables, with adapted write magnetic fields, orienting with certainty the magnetic moment vector of the ferromagnetic layer as close as possible to the barrier layer along a selected direction and orientation, while minimizing the maximum value reached by total magnetic moment $\vec{\mu}_{tot}$ of the free magnetic region during the write process.

Two examples of implementation of the write method according to the present invention will now be described. For clarity, a memory element 16 having its free magnetic region 18 comprising two ferromagnetic layers 26, 28, as shown in FIG. 2 will be considered with no loss of generality. Ferromagnetic layer 26 is formed of a first ferromagnetic material, for example, a cobalt and iron alloy, and has a thickness $e_1$ and a saturation magnetization $M_{S1}$. Ferromagnetic layer 28 is formed of a second ferromagnetic material, different from the first ferromagnetic material, for example, a nickel and iron alloy, and has a thickness $e_2$ and a saturation magnetization $M_{S2}$. Coupling layer 24 is for example a ruthenium layer having a thickness adapted to obtaining an antiferromagnetic interface coupling power having an intensity J per surface area unit.

Figure 4:
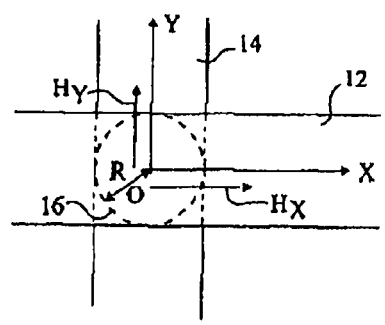
FIG. 4 schematically shows the orientation of write magnetic fields applied to a memory element according to the present invention.

FIG. 4 schematically shows memory element 16 according to the present invention, as seen from above, sandwiched between a word line 12 and a bit line 14. It is assumed that the three layers 24, 26, 28 have a same cross-section in the stacking direction, which is assumed, for simplification, to be circular and of radius R. As an example, R is approximately 45 nanometers.

The compensation of magnetic moment vectors $\vec{\mu}_1$ and $\vec{\mu}_2$ is thus obtained by the following equality:

$$M_{S1}e_1 = M_{S2}e_2$$

With the material indicated as an example, the compensation can be obtained for $e_1$ equal to approximately 5 nanometers and $e_2$ equal to approximately 10 nanometers.

Note $K_1$ and $K_2$ the effective planar anisotropy constants, respectively of ferromagnetic layers 26, 28. Given that, in the present example, each magnetic region 26, 28 is circular, anisotropy constants $K_1$, $K_2$ essentially reflect the anisotropies of crystallographic origin of ferromagnetic layers 26, 28. The anisotropy constants of ferromagnetic layers 26, 28 are selected to guarantee the non-volatility of memory element 16, for example, up to a duration of 10 years for an operating temperature on the order of 120° C. The effective planar anisotropy fields $H_{A1}$, $H_{A2}$, respectively associated with ferromagnetic layers 26, 28, are given by the following expressions:

$$H_{A1} = 2K_1/(\mu_0 M_{S1})$$

$$H_{A2} = 2K_2/(\mu_0 M_{S2})$$

where $\mu_0$ is the permeability of vacuum. In the present example, product $\mu_0 M_{S1}$ is equal to approximately 2.2 Tesla and product $\mu_0 M_{S2}$ is equal to approximately 1.1 Tesla. Exchange fields $H_{J1}$, $H_{J2}$ resulting from the antiferromagnetic exchange interaction and respectively associated with ferromagnetic layers 26, 28 are given by the following expressions:

$$H_{J1} = J/\mu_0 e_1 M_{S1}$$

$$H_{J2} = J/\mu_0 e_2 M_{S2}$$

An orthonormal referential (OX, OY, OZ) in which axis (OX) extends substantially along the longitudinal direction of word line 12, axis (OY) extends substantially along the longitudinal direction of bit line 14, and axis (OZ) (not shown) is perpendicular to plane (XOY) and extends along the stacking direction of memory element 16 is defined. Ferromagnetic layers 26, 28 are assumed to have a selected-magnetization direction along direction (OX).

For simplification, also assume that the effective anisotropy power along the stacking direction only depends on the shape anisotropy linked to the demagnetizing field tensor. The components following axis (OZ) of this tensor respectively associated with layers 26, 28, are noted $-N_{Z1}M_{S1}$ and $-N_{Z2}M_{S2}$, where $N_{Z1}$ and $N_{Z2}$ are the demagnetizing factors along axis (OZ).

Due to the symmetry of the equations describing the powers of anisotropy of crystallographic origin or of shape anisotropy, the method of the present invention remains valid for cases where the effective planar anisotropy and the anisotropy along the stacking direction mix crystallographic origin and shape contributions.

When a current crosses word line 12, it provides a substantially circumferential magnetic field around word line 12, which translates at the level of memory element 16 as a magnetic field $H_Y$ along direction (OY). When a current runs through bit line 14, it provides a circumferential magnetic field around bit line 14, which translates at the level of memory element 16 as a magnetic field $H_X$ along direction (OX). Magnetic field $H_X$ is positive if it is oriented towards increasing X values and negative if it is oriented towards decreasing X values. Magnetic field $H_Y$ is positive if it is oriented along increasing Y values and negative if it is oriented along decreasing Y values.

1) First Example of Implementation of the Write Method According to the Present Invention The first example of implementation of the method for writing into a memory element according to the present invention is based on the use of magnetic precession.

Figure 5:
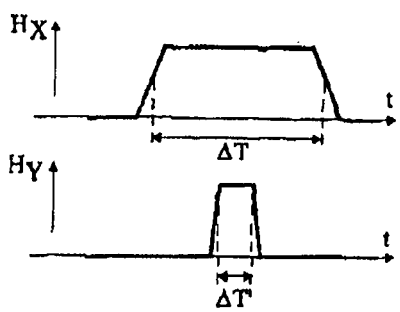
FIG. 5 shows a sequence of application of write magnetic fields according to a first example of implementation of the write method of the present invention.

FIG. 5 shows an example of a sequence of magnetic fields applied to memory element 16 to take advantage from the magnetic precession effect. In a write step, a pulsed magnetic field $H_X$ of a duration $\Delta T$ equal to approximately 400 picoseconds is applied to memory element 16. The sign of magnetic field $H_X$ may be positive or negative. During time $\Delta T$, a positive or negative pulsed magnetic field $H_Y$ of a duration $\Delta T'$ smaller than approximately 200 picoseconds is applied. To enable obtaining the precession phenomenon, the rise time of pulsed magnetic field $H_Y$ must theoretically be much shorter than the precession periods of $\vec{\mu}_1$ and $\vec{\mu}_2$. Experimentally, rise times on the order of from 60 to 80 ps enable triggering precessions of a period up to 6 GHz, corresponding to the parameters of the layers studied herein. The pulse of magnetic field $H_Y$ may be applied at any time during the pulse of magnetic field $H_X$, provided that $H_X$ alone is not sufficient to modify the orientations of $\vec{\mu}_1$ and $\vec{\mu}_2$. In the opposite case, the pulses of $H_X$ and $H_Y$ must be simultaneous within the limit of a time shift of the same order of magnitude as the previously-defined magnetic field rise time.

A possible description of the magnetic precession phenomenon desired in the method according to the present invention at the level of a compensated or almost compensated structure with two ferromagnetic layers 26, 28 is the following. The pulse of magnetic field $H_Y$ makes each magnetic moment vector $\vec{\mu}_1$, $\vec{\mu}_2$ come out of plane (XOY) by precession around axis (OY), with initially the same angular frequency. The occurrence of a component of $\vec{\mu}_1$ and $\vec{\mu}_2$ along axis (OZ) immediately creates demagnetizing fields along (OZ), of opposite directions for layers 26, 28. These demagnetizing fields attempt to have $\vec{\mu}_1$ and $\vec{\mu}_2$ rotate towards each other by precession around (OZ), which violates the principle of minimization of the antiferromagnetic interaction power through layer 24. Under the effect of all the magnetic power sources in the system (antiferromagnetic interaction power, fields $H_X$, $H_Y$, demagnetizing fields and anisotropy power of crystallographic origin), one of vectors $\vec{\mu}_1$ and $\vec{\mu}_2$ (called hereafter the "master vector") will continue its precession around (OZ), driving the other vector (called hereafter the "slave vector") which will thus start its way back and start a rotation of same direction keeping as much as possible the antiparallel alignment between $\vec{\mu}_1$ and $\vec{\mu}_2$, which minimizes the maximum value reached by total magnetic moment vector $\vec{\mu}_{tot}$ during the process. According to the exact parameters of the experiment, additional precessions of small amplitude may superpose to the average operation described hereabove without putting its principle at stake.

This phenomenon of simultaneous reversal of $\vec{\mu}_1$ and $\vec{\mu}_2$ minimizing $\vec{\mu}_{tot}$ can be obtained for identical layers 26, 28, but it then only enables a toggle write mode. The differentiation of the magnetic properties of layers 26, 28 enables obtaining a direct write mode. In the latter, for adapted couples of values of magnetic fields $H_X$, $H_Y$, it can be ensured that according to their initial positions, $\vec{\mu}_1$ and $\vec{\mu}_2$ keep their initial positions or perform a precession around the associated demagnetizing magnetic field to reach positions opposite to the initial positions. For adapted couples of magnetic fields $H_X$ and $H_Y$, it can thus be ensured that the final position of the magnetic moment vector closest to barrier layer 20 is according to a desired orientation and direction.

Figure 6:
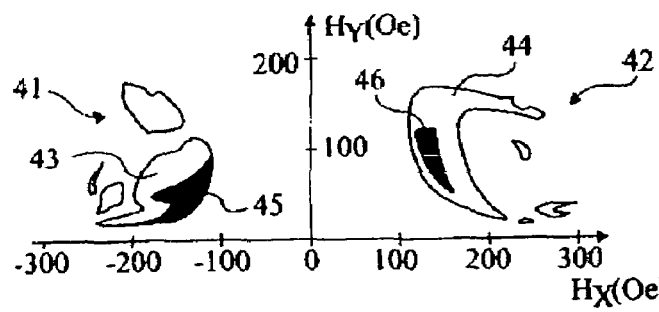
FIGS. 6 and 7 illustrate the determination of ranges of write magnetic field values according to the first example of implementation of the write method of the present invention.

As an example, FIG. 6 shows a non-complete set of areas 41, 42 of amplitudes of magnetic fields $H_X$ and $H_Y$, magnetic field $H_Y$ being positive, for which a toggle of $\vec{\mu}_1$, initially oriented along axis (OX) according to the decreasing X values, is systematically obtained. This diagram has been determined with the following values of the magnetic properties of the layers: $e_1$=5 nm, $M_{S1}$=2.2 Tesla, $e_2$=10 nm, $M_{S2}$=1.1 Tesla, $H_{A1}$=5.41 kA/m (=68 Oe), $H_{A2}$=1.11 kA/m (=14 Oe), $\Delta T$=$\Delta T'$=200 ps, $H_{J1}$=$H_{J2}$=15.9 kA/m (=200 Oe). For a negative magnetic field $H_Y$, the obtained areas are symmetrical with respect to the abscissa axis. Areas 41 corresponding to negative magnetic fields $H_X$ and areas 42 corresponding to positive magnetic fields $H_X$ for which a toggle of $\vec{\mu}_1$ is observed are both obtained.

Areas 41, 42 comprise "white" portions 43, 44, delimited by the curves in full lines which correspond to magnetic fields $H_X$ and $H_Y$ for which the norm of $\vec{\mu}_{tot}$, noted hereafter as $\mu_{tot}$, exceeds the norm of magnetic moment vector $\vec{\mu}_1$, noted $\mu_1$ hereafter, at least at a time during the toggle of $\vec{\mu}_1$. Areas 41, 42 comprise black portions 45, 46, which correspond to magnetic fields $H_X$ and $H_Y$ for which $\mu_{tot}$ never exceeds $\mu_1$ during the toggle of $\vec{\mu}_1$.

To minimize interactions between memory element 16 and the adjacent memory elements, it is thus preferable to remain limited to magnetic fields $H_X$ and $H_Y$ associated with black portions 45, 46. It must further be kept to magnetic fields $H_X$ and $H_Y$ for which, whatever the initial orientation of $\vec{\mu}_1$, the same final orientation is always obtained. This is obtained by taking into account the fact that areas 41 and 42 are not symmetrical with respect to the ordinate axis due to the dissymmetry of the magnetic properties of ferromagnetic layers 26, 28.

Figure 7:
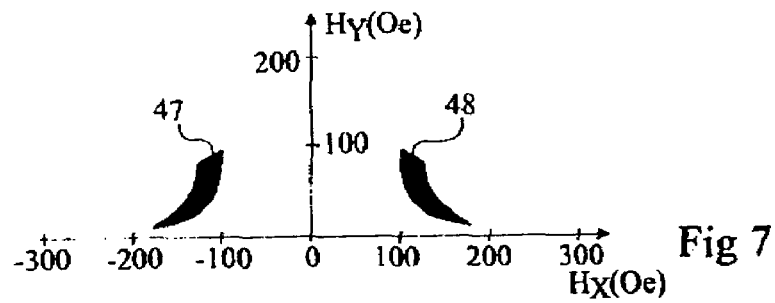

FIG. 7 shows write areas 47, 48 obtained from areas 41, 42 of FIG. 5, and corresponding to values of magnetic fields $H_X$, $H_Y$ which impose a determined final orientation of $\vec{\mu}_1$, whatever its initial orientation. This is obtained by superposing areas 41 and 42 of FIG. 6 to areas corresponding to the symmetricals of areas 41, 42 with respect to the ordinate axis and by only retaining the areas which are not common and for which $\mu_{tot}$ never exceeds $\mu_1$. Magnetic fields $H_X$ and $H_Y$ associated with write area 47 enable ensuring that $\vec{\mu}_1$ is finally oriented towards increasing X values and the magnetic fields $H_X$ and $H_Y$ associated with write area 48 enable ensuring that $\vec{\mu}_1$ is finally oriented towards decreasing X values.

Figure 8A:
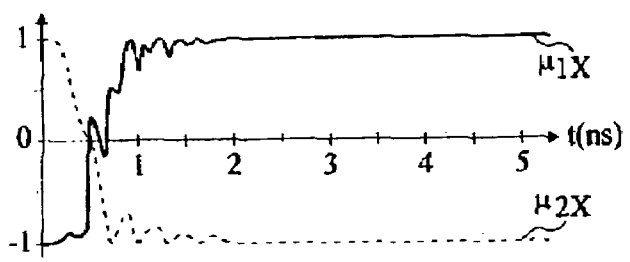
FIGS. 8A to 8C show the variations of the components of the magnetic moment vectors of the free magnetic region of the memory element according to the present invention for different write magnetic fields according to the first embodiment of the write method.
Figure 8B:
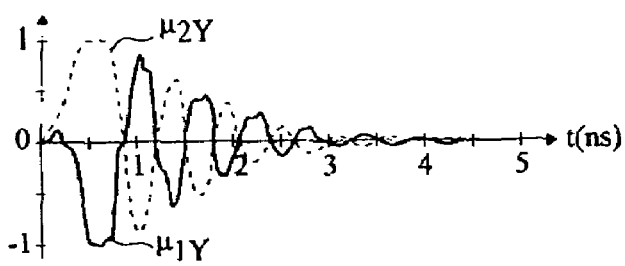
Figure 8C:
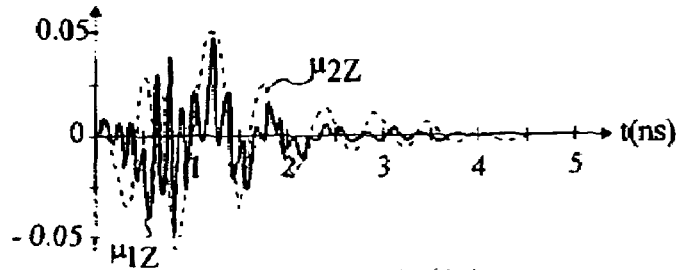

FIGS. 8A to 8C respectively show a simulation of the variation of components $\mu_{1X}$, $\mu_{1Y}$, $\mu_{1Z}$ (curves in full lines) of $\vec{\mu}_2$, in referential (OX, OY, OZ) and of components $\mu_{2X}$, $\mu_{2Y}$, $\mu_{2Z}$ (curves in dotted lines) of $\vec{\mu}_2$ for a negative magnetic field $H_X$ having an amplitude equal to 9,710 A/m (=122 Oe) and a positive magnetic field $H_Y$ having an amplitude equal to 1,590 A/m (=20 Oe). The simulation uses the same parameters as those used to calculate FIGS. 6 and 7. The components are normated at $\mu_1$, which is identical to $\mu_2$, the norm of $\vec{\mu}_2$, for a compensated memory element.

As appears from FIGS. 8A to 8C, $\vec{\mu}_1$, and $\vec{\mu}_2$ are initially oriented along axis (OX) respectively towards decreasing and increasing X values. Initial time t=0 corresponds to the setting of magnetic field $H_Y$. It can be observed that $\vec{\mu}_1$ toggles in less than 1 nanosecond after application of the pulse of magnetic field $H_Y$ to orient along axis (OX) towards increasing X values. After the toggle, oscillations of smaller amplitude can be observed for a few nanoseconds. However, the oscillations appear to be widely damped off after 3 nanoseconds. At 5 nanoseconds, the state of memory element 16 is completely stabilized. The first example of implementation of the write method according to the present invention thus enables achieving a write period of approximately 3 nanoseconds with the parameters used herein for the calculation, aside from any optimization.

Further, $\mu_{tot}$ remains very small all along the toggle of $\vec{\mu}_1$ and, in particular, at no time does it exceed $\mu_1$. Moreover, $\mu_{tot}$ takes its maximum value only over a very short duration during the toggle of $\vec{\mu}_1$. The part taken by $\vec{\mu}_{tot}$ in the disturbances of the memory elements adjacent to the addressed memory element because of dipolar interactions is thus very small. Further, the short duration and the small amplitudes of magnetic fields $H_X$ and $H_Y$ enable minimizing the power required for the writing.

By many simulations over a wide range of magnetic parameters, and a detailed study of the obtained behaviors, the applicant has besides found that the direct write process according to this first example of the present invention is more favorable when the ferromagnetic layer of stronger saturation magnetization also has the strong effective planar anisotropy.

More generally, in the design of the free magnetic region of a compensated or almost compensated memory element, the conjunction of the dissymmetry of the anisotropy field of crystallographic origin and of the demagnetizing fields must be ensured to increase the dissymmetry of areas 41, 42 and reduce the amplitude of fields $H_X$, $H_Y$ necessary to the write process.

Figure 9:
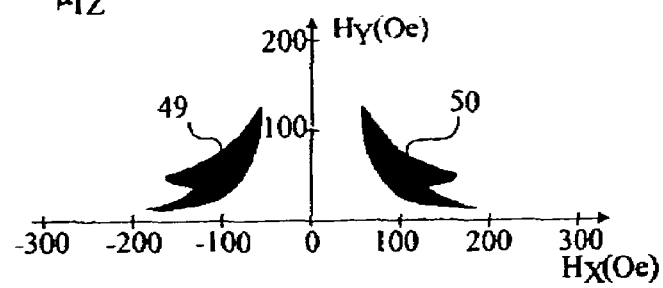
FIGS. 9 and 10 show ranges of write magnetic field values according to the first example of implementation of the write method according to the present invention for an almost compensated memory element according to the present invention.

FIG. 9 shows write areas 49, 50 analogous to write areas 47, 48 of FIG. 7 and calculated with the same magnetic parameters except for $e_2=12$ nm, which provides $\mu_2=1.2$ $\mu_1$. Memory element 16 then has no longer a compensated structure but an almost compensated structure. An increase in the surface area of write areas 49, 50 with respect to FIG. 7 can be observed. In particular, the writing into the memory element can be performed with magnetic fields $H_X$ and $H_Y$ having amplitudes smaller than the respective amplitudes of the magnetic fields required for the writing into a compensated memory element.

Figure 10:
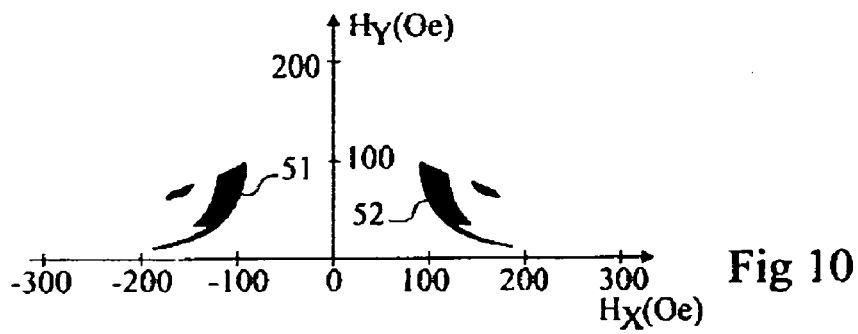

FIG. 10 shows write areas 51, 52, analogous to write areas 47, 48 of FIG. 7 and calculated with the same magnetic parameters except for $e_1=6$ nm, which provides $\mu_1=1.2$ $\mu_2$. A decrease in the surface area of write areas 51, 52 with respect to FIG. 7 can be observed. Such a modification of the compensation of the memory element is thus not desirable.

The physical origin of the differences between FIGS. 9 and 10 is linked to the fact that, with the values of magnetic fields $H_X$ and $H_Y$ corresponding to write areas 47, 48 of FIG. 7, $\vec{\mu}_2$ is the master vector and $\vec{\mu}_1$ is the slave vector in the write process. By analyzing in detail the various corresponding magnetic powers and actions, it can be verified that a slight decompensation of the free magnetic area which reinforces the norm of the master vector (respectively, the slave vector) is favorable to the write process (respectively, unfavorable), in that it decreases (respectively, increases) fields $H_X$ and $H_Y$ necessary to the writing, and increases (respectively, decreases) the extension of the area of fields $H_X$ and $H_Y$ enabling direct writing.

More generally, for a free magnetic region 18 having two or more ferromagnetic layers, more favorable write areas are obtained by selecting an almost compensated rather than compensated structure, formed by stacking, as in FIG. 3, free almost compensated magnetic regions 18, 18', 18" where the norm of the magnetic moment vector acting as a master vector in the write process has been increased.

The applicant has shown the presence of a write magnetic field range of relatively moderate amplitudes enabling writing of a compensated memory element, and has described the method for optimizing the location and the extent of this range by playing on the dissymmetry of the magnetic properties of the free magnetic region of the memory element. Further, the application has shown that the amplitude of the magnetic fields usable for the writing into a memory element by selecting a specific almost compensated structure can be decreased.

2) Second Example of Implementation of the Write Method According to the Present Invention The second example of implementation of the method for writing into a memory element according to the present invention is based on the use of the response difference of magnetic moment vectors $\vec{\mu}_1$ and $\vec{\mu}_2$ upon application of a magnetic field (with a slow rise time with respect to the setting of a precession mode), when a difference exists between the planar effective anisotropy fields of the ferromagnetic layers of the free magnetic region of the memory element. For a memory element 16 having a compensated or almost compensated free magnetic region 18 with two ferromagnetic layers, anisotropy field $H_{A1}$ of ferromagnetic layer 26 adjacent to barrier layer 20 is greater than anisotropy field $H_{A2}$ of the other ferromagnetic layer 28. For a memory element 16 having a free magnetic region comprising at least three ferromagnetic layers and formed by a stacking of compensated or almost compensated free magnetic regions as described for and shown in FIG. 3, the anisotropy field of a ferromagnetic layer having its associated magnetic moment vector oriented like the magnetic moment vector associated with the ferromagnetic layer adjacent to the barrier layer is greater than the anisotropy field of any ferromagnetic layer having its magnetic moment oriented in the direction opposite to that of the magnetic moment vector associated with the ferromagnetic layer adjacent to the barrier layer.

Figure 11A:
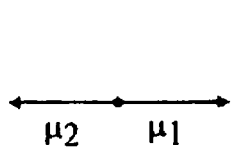
FIGS. 11A to 11C, 12A to 12C, 13, 14A, 14B, 15A, and 15B schematically describe the variation of the orientation of magnetic moment vectors of the free magnetic region in the writing into a compensated or almost compensated memory element according to the present invention for different write magnetic fields according to a second write method example.
Figure 11B:
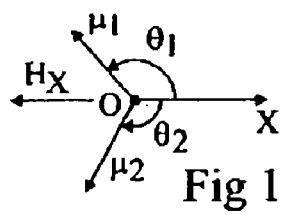
Figure 11C:
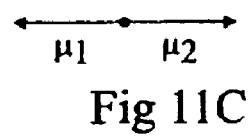

FIGS. 11A to 11C illustrate successive steps of the writing into a memory element 16 according to the present invention by the second example of implementation of the write process consisting of applying a magnetic field $H_X$ alone, magnetic field $H_Y$ being maintained at zero.

FIG. 11A schematically shows the orientation of $\vec{\mu}_1$ and $\vec{\mu}_2$ before application of magnetic field $H_X$. $\vec{\mu}_1$ is initially oriented along axis (OX) towards increasing X values and $\vec{\mu}_2$ is initially oriented along axis (OX) towards decreasing X values. The same magnetic property values of the layers as for FIGS. 6 and 7 are used for the example, that is: $e_1=5$ nm, $M_{S1}=2.2$ Tesla, $e_2=10$ nm, $M_{S2}=1.1$ Tesla, $H_{A1}=5.41$ kA/m (=68 Oe), $H_{A2}=1.11$ kA/m (=14 Oe), $H_{J1}=H_{J2}=15.9$ kA/m (=200 Oe). The calculation being made for a zero temperature, times $\Delta T$ and $\Delta T'$ of application have no meaning in this calculation. In a real experimental process, it is enough for these durations to be longer than the times of relaxation of magnetic moment vectors $\vec{\mu}_1$ and $\vec{\mu}_2$ towards their positions of equilibrium. The applicant has shown that for a negative magnetic field $H_X$ having an absolute value smaller than 11,937 A/m (=150 Oe), the orientation of $\vec{\mu}_1$ does not significantly change, and any change remains reversible. For a negative magnetic field $H_X$ having an absolute value greater than 11,937 A/m (=150 Oe), an irreversible switching, also called "spin-flop", can be observed.

FIG. 11B shows an example of a configuration obtained for the application of a negative magnetic field $H_X$ having an absolute value equal to 14,334 A/m (=180 Oe). The angle formed by $\vec{\mu}_1$ and axis (OX) is called $\theta_1$ and the angle formed by $\vec{\mu}_2$ and axis (OX) is called $\theta_2$. According to the present example, $\theta_1$ is equal to approximately +132° and $\theta_2$ is equal to approximately −119°, but state [$\theta_1=-132°$ and $\theta_2=+119°$] is also possible with the same magnetic power and thus the same probability. When magnetic field $H_X$ is reset to zero, under the effect of its greatest planar effective anisotropy power, $\vec{\mu}_1$ joins axis (OX) towards the decreasing X values and $\vec{\mu}_2$ switches to align along axis (OX) towards increasing X values under the effect of the antiferromagnetic interaction.

FIG. 11C schematically shows the orientation of $\vec{\mu}_1$ and $\vec{\mu}_2$ after spin-flop. $\vec{\mu}_1$ is oriented along axis (OX) towards decreasing X values and $\vec{\mu}_2$ is oriented along axis (OX) towards increasing X values.

Figure 12A:
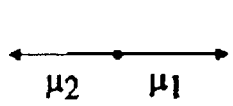
Figure 12B:
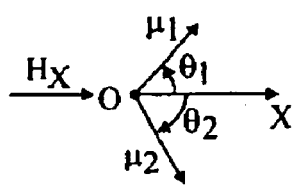
Figure 12C:
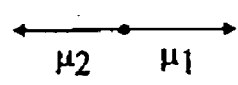

FIGS. 12A to 12C show figures similar to FIGS. 11A and 11C when a positive magnetic field $H_X$ is applied to memory element 16.

FIG. 12A is identical to FIG. 11A. In FIG. 12B, for a positive magnetic field $H_X$ having an absolute value of approximately 14,334 A/m (=180 Oe), an angle $\theta_1$ of approximately +48° and an angle $\theta_2$ of approximately −61° are obtained, but state [$\theta_1=48°$ and $\theta_2=+61°$] is also possible with the same magnetic power and thus the same probability. When magnetic field $H_X$ is set back to zero, under the effect of its greatest planar effective anisotropy power, $\vec{\mu}_1$ aligns back on axis (OX) towards the decreasing X values. $\vec{\mu}_2$ is then sent back along axis (OX) towards increasing X values under the effect of the antiferromagnetic interaction. The configuration shown in FIG. 12C, identical to FIG. 12A, is then obtained.

A direct writing method is thus obtained since $\vec{\mu}_1$ is oriented in determined fashion, according to the applied magnetic field $H_X$, whatever the initial configuration. Further, the memory element according to the present invention enables obtaining a direct writing with the application of a single magnetic field $H_X$.

The applicant has shown that when a positive magnetic field $H_Y$ having an absolute value of approximately 1,591 A/m (=20 Oe) is applied simultaneously to $H_X$, a switching of $\vec{\mu}_1$ and $\vec{\mu}_2$ is obtained for a negative magnetic field $H_X$ having an absolute value greater than approximately 10,345 A/m (=130 Oe), that is, for a magnetic field $H_X$ having an absolute value smaller than the absolute value of magnetic field $H_X$ applied alone in the previously-described example. A magnetic field $H_Y$ alone with an absolute value of approximately 1,591 A/m (=20 Oe) is not enough to switch $\vec{\mu}_1$ and $\vec{\mu}_2$, and since the switching absolute value of magnetic field $H_X$ is lowered when magnetic fields $H_X$ and $H_Y$ are simultaneously applied, it is possible to use a pair of magnetic fields $H_X$ and $H_Y$ to directly write information into a single memory element 16 without changing the state of the memory elements which are only addressed by one or the other of magnetic fields $H_X$ or $H_Y$. With the free magnetic region parameters retained for the calculation, an increase in the absolute value of magnetic field $H_Y$ beyond approximately 2000 A/m (a few tens of Oe) is not favorable to obtain the switching of $\vec{\mu}_1$ and $\vec{\mu}_2$, since it is then necessary to apply a magnetic field $H_X$ having a greater amplitude to obtain the switching.

Figure 13:
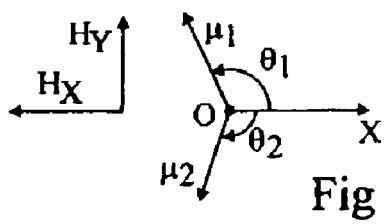

FIG. 13 shows, as an example, the positions of $\vec{\mu}_1$ and $\vec{\mu}_2$, similarly to FIG. 11B and starting from the configuration of FIG. 11A, in the case where a negative magnetic field $H_X$ and a positive magnetic field $H_Y$ are applied. As an example, for a negative magnetic field $H_X$ having an absolute value of approximately 11,141 A/m (=140 Oe), $\theta_1$ is obtained to be equal to 115° and $\theta_2$ is obtained to be equal to approximately -108°.

Figure 14A:
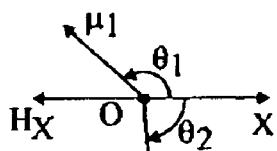
Figure 14B:
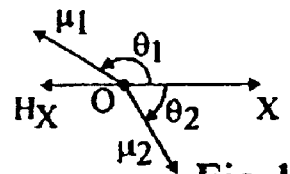

FIGS. 14A and 14B each show the orientation of $\vec{\mu}_1$ and $\vec{\mu}_2$, similarly to FIG. 11B and starting from the configuration of FIG. 11A, in the case where only a negative magnetic field $H_X$ is applied and in the case where free magnetic region 18 comprises a slight dissymmetry in the compensation of the magnetic moment vectors.

In FIG. 14A, $\mu_1=1.1\mu_2$, taking $e_1=5.5$ nm. A switching is obtained for a negative magnetic field $H_X$ having an absolute value greater than approximately 11,937 A/m (=150 Oe). For example, for a magnetic field $H_X=-11,937$ A/m (=-150 Oe), $\theta_1$ is then equal to approximately 138° and $\theta_2$ is equal to approximately -85°, which corresponds to $\mu_{tot}=0.77\mu_2$.

In FIG. 14B, $\mu_1=1.2\mu_2$ is obtained by taking $e_1=6$ nm. A switching is obtained for a negative magnetic field $H_X$ having an absolute value greater than approximately 10,345 A/m (=130 Oe). For a negative magnetic field $H_X$ having its absolute value equal to 10,345 A/m (=130 Oe), $\theta_1$ is then equal to approximately 149° and $\theta_2$ is equal to approximately -59°, which corresponds to $\mu_{tot}=0.57\mu_2$.

When $\mu_1$ is smaller than $\mu_2$, it is necessary to use magnetic fields of greater amplitudes to obtain the switching of $\vec{\mu}_1$ and $\vec{\mu}_2$, which is not desirable.

Figure 15A:
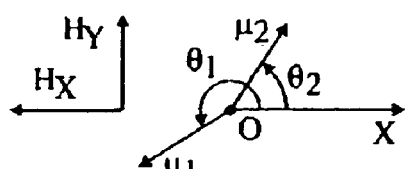
Figure 15B:
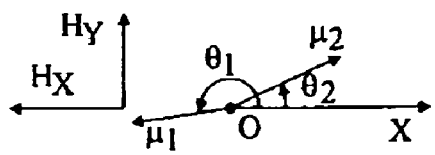

FIGS. 15A and 15B each show the orientation of $\vec{\mu}_1$ and $\vec{\mu}_2$, similarly to FIG. 13, in the case where a negative magnetic field $H_X$ and a positive magnetic field $H_Y$ are applied simultaneously and in the case where free magnetic region 18 of memory element 16 comprises a slight dissymmetry in the compensation of the magnetic moment vectors.

In FIG. 15A, $\mu_1=1.1\mu_2$ is obtained by taking $e_1=5.5$ nm. For a positive magnetic field $H_Y$ having an absolute value on the order of 2,387 A/m (=30 Oe), a switching can be observed for a negative magnetic field $H_X$ having an absolute value greater than approximately 9,151 A/m (=115 Oe). As an example, for a negative magnetic field $H_X$ having an absolute value equal to 10,345 A/m (=130 Oe), $\theta_1$ is equal to approximately 212° and $\theta_2$ is equal to approximately 57°. $\vec{\mu}_2$ has then rotated by an angle greater than 180°. During the switching, $\mu_{tot}$ is equal to approximately 0.46 $\mu_2$. Such a memory element is particularly advantageous since when magnetic field $H_Y$ is zero, the minimum amplitude of write magnetic field $H_X$ is greater than 150 Oe. Further, $\mu_{tot}$ remains relatively small. There then is a significant minimum amplitude difference of write magnetic field $H_X$, while keeping relatively moderate amplitudes. This is favorable especially to avoid an unwanted writing of memory elements other than the addressed memory element.

In FIG. 15B, $\mu_1=1.2\mu_2$ is obtained by taking $e_1=6$ nm. For a magnetic field $H_Y$ having an absolute value on the order of 2,387 A/m (=30 Oe), a switching can be observed for a negative magnetic field $H_X$ having an absolute value greater than 8,355 A/m (=105 Oe). As an example, for a negative magnetic field $H_X$ having an absolute value equal to 9,549 A/m (=120 Oe), $\theta_1$ is equal to approximately 188° and $\theta_2$ is equal to approximately 25°. $\vec{\mu}_2$ has then rotated by an angle greater than 180°. $\mu_{tot}$ remains almost constant during the switching and substantially equal to 0.46 $\mu_2$. Such a case is relatively less advantageous than the former since the difference between the minimum absolute values of write magnetic field $H_X$, for a magnetic field $H_Y$ of zero amplitude and of an amplitude equal to 8,355 A/m (=30 Oe), is smaller.

Generally, a decompensation of free magnetic region 18 of memory element 16 consisting of increasing the norm of the magnetic moment associated with the strongest planar effective anisotropy field enables decreasing the minimum amplitude of the magnetic field $H_X$ to be applied for the writing into the memory element.

More generally, for a free magnetic region 18 having more than two ferromagnetic layers, more favorable write field amplitudes are obtained by selecting an almost compensated rather than compensated structure, formed by stacking, as in FIG. 3, almost compensated free magnetic regions of type 16, where for each ferromagnetic layer, the norm of the magnetic moment vector associated with the strongest planar effective anisotropy field has been reinforced.

In the above description of the second example of implementation of the write method according to the present invention, the selection of a greater effective planar anisotropy for layer 26 adjacent to barrier layer 20 ensures that magnetic moment vector $\vec{\mu}_1$ of layer 26 acts as a master vector in the write process. Due to the symmetry in the magnetism equations, the same direct write method (only the sign of $H_X$ must change) may be performed by giving a greater planar effective anisotropy to layer 28, the magnetic moment vector $\vec{\mu}_2$ of this layer 28 then acting as the master vector in the write process, and the antiferromagnetic coupling between layers 26 and 28 through layer 24 guaranteeing the final alignment of magnetic moment vector $\vec{\mu}_1$.

It is finally important to underline that this second example of implementation of the write method according to the present invention enables, by applying a static field of adapted components $H_X$ and $H_Y$, uniform or almost uniform over an entire MRAM, giving the same orientation to all the free magnetic regions of all the memory elements in the network. Such a field may easily be created by sources external to the circuit (magnet, electromagnet). Such an action may be useful, for example, to set or reset the operation of a memory, for example, at the end of its manufacturing, or to very quickly erase an entire MRAM when the security of an information depends on this.

This last setting method is also identically applicable to a MRAM defined in the meaning of the first example of implementation of the write method according to the present invention, provided that there exists a planar effective anisotropy field difference for the ferromagnetic layers of the free magnetic region of the compensated or almost compensated memory element.

Of course, the present invention is likely to have various alterations, modifications and improvements, which will readily occur to those skilled in that art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A magnetoresistive memory element comprising:
a trapped magnetic region and a free magnetic region separated by a barrier layer, the free magnetic region including a stack of at least two antiferromagnetically-coupled ferromagnetic layers, a layer magnetic moment vector being associated with each ferromagnetic layer, a resulting magnetic moment vector, equal to a sum of the layer magnetic moment vectors, having an amplitude smaller than at least 40% of an amplitude of the layer magnetic moment vector of greatest amplitude, wherein at least one of an anisotropy field or demagnetizing field tensor is not identical for the at least two ferromagnetic layers within the stack, whereby a plurality of angular deviations of the layer magnetic moment vectors are different at the time of an application of an external magnetic field and wherein the magnetic moment vector of the ferromagnetic layer of the free magnetic region in contact with the barrier layer is oriented according to one of two opposite orientations of a selected direction, and is concurrently responsive to a first magnetic field alone the selected direction, and a second magnetic field according to a direction substantially perpendicular to the selected direction.

2. The magnetoresistive memory element of claim 1, wherein the free magnetic region comprises:
a stacking of at least two pairs of antiferromagnetically-coupled ferromagnetic layers, a layer magnetic moment vector being associated with each layer, the resulting magnetic moment vector of each pair of antiferromagnetically-coupled ferromagnetic layers, is equal to the sum of the magnetic moment vectors of the ferromagnetic layers of the pair of antiferromagnetically-coupled ferromagnetic layers, having an amplitude smaller than at least 40% of the amplitude of the layer magnetic moment vector of greatest amplitude, the adjacent ferromagnetic layers of the two pairs of ferromagnetic layers being ferromagnetically coupled, and wherein the anisotropy field and/or the demagnetizing field tensor is not identical for the two ferromagnetic layers of at least one pair of ferromagnetic layers, the arrangement and the properties of the ferromagnetic layers in each pair of ferromagnetic layers being adapted so that the layer magnetic moment vectors of two ferromagnetically-coupled adjacent ferromagnetic layers acquire identical angular deviations at the time of the application of an external magnetic field.

3. The magnetoresistive memory element of claim 1, wherein the free magnetic region comprises a stack of at least a first, a second, and a third ferromagnetic layers, the first and second ferromagnetic layers being antiferromagnetically coupled, the second and the third ferromagnetic layers being antiferromagnetically coupled, a layer magnetic moment vector being associated with each of the first, second, and third ferromagnetic layers, the resulting magnetic moment vector, equal to the sum of the layer magnetic moment vectors of the first, second, and third ferromagnetic layers, having an amplitude smaller than at least 40% of the amplitude of the magnetic moment vector of the second ferromagnetic layer, and wherein the anisotropy fields and/or the demagnetizing field tensors of the first or third ferromagnetic layer and of the second ferromagnetic layer are different, whereby a plurality of angular deviations associated with the layer magnetic moment vectors of the first and third ferromagnetic layers are identical to each other and different from the angular deviation of the second ferromagnetic layer at the time of the application of an external magnetic field.

4. A method for writing into a memory element having a trapped magnetic region and a free magnetic region separated by a barrier layer, the free magnetic region including a stack of at least two antiferromagnetically coupled ferromagnetic layers having an anisotropy field and a demagnetizing field, where at least one of the anisotropy fields or demagnetizing fields are different from the corresponding field in the other layer, and wherein a magnetic moment vector of the ferromagnetic layer of the free magnetic region in contact with the barrier layer is oriented according to one of two opposite orientations of a selected direction, comprising the steps of:

applying a first magnetic field along the selected direction to the memory element; and concurrently applying a second magnetic field to the memory element along a direction substantially perpendicular to the selected direction.

5. The method of claim 4, wherein the demagnetizing field tensor and/or the anisotropy field of crystallographic origin is not identical for the at least two ferromagnetic layers, and wherein the second magnetic field is applied during the application of the first magnetic field in the form of a pulse having a rise time smaller than half the smallest precession period of the ferromagnetic layers.

6. The method of claim 4, wherein the effective planar anisotropy fields of the at least two antiferromagnetically-coupled ferromagnetic layers have different amplitudes, and wherein the first and second magnetic fields are concurrently applied for a time period longer than a relaxation time of a layer magnetic moment vector of the ferromagnetic layers of the free magnetic region towards respective determined equilibrium positions.

7. The method of claim 6, wherein the amplitude of the second magnetic field is smaller than half the amplitude of the first magnetic field.

8. The method of claim 6, wherein a setting time and/or a duration of application of the first and second magnetic fields are different.

9. The method of claim 6, wherein the first and second magnetic fields are applied globally to a memory formed of a plurality of memory elements, using a magnetic field source external to the memory, whereby the memory is initialized.

10. The method of claim 6, wherein the first and second magnetic fields are applied to a memory formed of a plurality of memory elements, using a magnetic field source external to the memory, whereby the memory is erased.

11. A memory device comprising:
a trapped magnetic region and a free magnetic region, the free magnetic region having an assembly of at least three ferromagnetically coupled pairs of antiferromagnetically-coupled ferromagnetic layers, each layer having a magnetic moment vector associated therewith, and each layer further having an anisotropy field and a demagnetizing field associated therewith, wherein at least one of the anisotropy field or the demagnetizing field of the ferromagnetic layers of each pair have different amplitudes from the corresponding field in the other layer.

12. The memory device of claim 11 wherein the ferromagnetic layers are formed of at least two different ferromagnetic materials each having a different saturation magnetization.

13. The memory device of claim 11 wherein, a resulting magnetic moment vector, equal to a sum of the layer magnetic moment vectors, has an amplitude smaller than 40% of the amplitude of the layer magnetic moment vector of greatest amplitude.

14. The memory device of claim 11 wherein each of the ferromagnetic layers have unique cross-sections in a plane perpendicular to the direction of assembly.

15. A memory device comprising:
a first ferromagnetic layer having a saturation magnetization, an anisotropy field, and a demagnetizing field; and
a second ferromagnetic layer antiferromagnetically coupled to the first ferromagnetic layer, the second layer having a saturation magnetization, an anisotropy field, and a demagnetizing field, at least one of the anisotropy field or demagnetizing field of the second ferromagnetic layer is different from the corresponding field of the first ferromagnetic layer, and when the ferromagnetic layers have different anisotropy fields, the ferromagnetic layer having the stronger anisotropy field also has stronger saturation magnetization.

16. The memory device of claim 15 where at least one of the anisotropy field or demagnetizing field of the second ferromagnetic layer has a different shape than the corresponding field of the first ferromagnetic layer.

17. The memory device of claim 16 where at least one of the anisotropy field or demagnetizing field of the second ferromagnetic layer has a different amplitude than the corresponding field of the first ferromagnetic layer.

18. A magnetoresistive memory element comprising:
a trapped magnetic region and a free magnetic region separated by a barrier layer, the free magnetic region including a stack of at least two antiferromagnetically-coupled ferromagnetic layers, the two layers having different magnetic field properties from each other;
a layer magnetic moment vector being associated with each ferromagnetic layer; and
a resulting magnetic moment vector, which is equal to a sum of the ferromagnetic layer magnetic moment vectors, having an amplitude smaller than 40% of an amplitude of the ferromagnetic layer magnetic moment vector of greatest amplitude.

19. The magnetoresistive memory element of claim 18 wherein at least one of an anisotropy field or demagnetizing field tensor is not identical for the at least two ferromagnetic layers within the stack.

20. The magnetoresistive memory element of claim 18 wherein angular deviations of the layer magnetic moment vectors are different at the time of an application of an external magnetic field.

21. The magnetoresistive memory element of claim 18 wherein the free magnetic region is responsive to a second magnetic field applied after a first magnetic field is applied and the second magnetic field is removed before the first magnetic field is removed.

22. A method for writing a memory element comprising, the steps of:
applying a first magnetic field along a first direction to the memory element, said memory element having a trapped magnetic region and a free magnetic region separated by a barrier layer, the free magnetic region having a stack of at least two antiferromagnetically coupled ferromagnetic layers, each ferromagnetic layer having an anisotropy field and a demagnetizing field, and at least one of the anisotropy fields or demagnetizing fields are different from the corresponding field in the other ferromagnetic layer;
applying a second magnetic field to the memory element along a second direction substantially perpendicular to the first direction; and
removing the second magnetic field while the first magnetic field is present.

23. The method of claim 22 wherein a magnetic moment vector of the ferromagnetic layer of the free magnetic region in contact with the barrier layer is oriented according to one of two opposite orientations of a first direction.

24. The method of claim 22 wherein the first magnetic field is removed after the second magnetic field is removed.

* * * * *